(12) United States Patent
Kim

(10) Patent No.: US 8,138,444 B2
(45) Date of Patent: Mar. 20, 2012

(54) PLASMA PROCESSING APPARATUS

(75) Inventor: Sung Ryul Kim, Seongnam-si (KR)

(73) Assignee: Tes Co., Ltd., Yongin-Si (KR)

( * ) Notice: Subject to any disclaimer, the term of this patent is extended or adjusted under 35 U.S.C. 154(b) by 943 days.

(21) Appl. No.: 12/143,465

(22) Filed: Jun. 20, 2008

(65) Prior Publication Data

US 2009/0250443 A1    Oct. 8, 2009

(30) Foreign Application Priority Data

Apr. 3, 2008 (KR) .................. 10-2008-0031042

(51) Int. Cl.
*B23K 10/00* (2006.01)

(52) U.S. Cl. ......... 219/121.36; 219/121.43; 219/121.58; 118/723 I; 156/345.24

(58) Field of Classification Search ............... 219/121.4, 219/121.41, 121.43, 121.44; 118/723 R, 118/723 I; 156/345.38, 345.27, 345.24
See application file for complete search history.

(56) References Cited

U.S. PATENT DOCUMENTS

| | | | |
|---|---|---|---|
| 5,707,485 A | 1/1998 | Rolfson et al. | |
| 5,733,511 A | 3/1998 | De Francesco | |
| 5,853,483 A * | 12/1998 | Morita et al. | 118/712 |
| 6,953,515 B2 * | 10/2005 | Boyd et al. | 156/345.16 |
| 7,330,261 B2 * | 2/2008 | Van Haren et al. | 356/401 |
| 7,520,956 B2 * | 4/2009 | Samukawa et al. | 156/345.28 |
| 2001/0000104 A1 | 4/2001 | Li et al. | |
| 2001/0016079 A1 | 8/2001 | Goyal et al. | |
| 2004/0035529 A1 * | 2/2004 | Grimbergen | 156/345.24 |
| 2004/0035532 A1 | 2/2004 | Jung | |
| 2005/0095732 A1 | 5/2005 | Maebashi et al. | |
| 2005/0167051 A1 | 8/2005 | Hoffman et al. | |
| 2006/0278339 A1 | 12/2006 | Kim et al. | |
| 2007/0068900 A1 | 3/2007 | Kim et al. | |
| 2008/0135177 A1 | 6/2008 | Kim | |
| 2008/0277064 A1 | 11/2008 | Kim | |

FOREIGN PATENT DOCUMENTS

| | | |
|---|---|---|
| CN | 1477681 | 2/2004 |
| CN | 1692475 A | 11/2005 |
| JP | 54-058361 | 5/1979 |
| JP | 60-012734 | 1/1985 |
| JP | 61-265820 | 11/1986 |
| JP | 04-317325 | 11/1992 |
| JP | 05-136098 | 6/1993 |
| JP | 10-289881 | 10/1998 |
| JP | 10-326772 | 12/1998 |
| JP | 2000-012472 | 1/2000 |
| JP | 2000-195851 | 7/2000 |
| JP | 2001-140085 | 5/2001 |

(Continued)

*Primary Examiner* — Mark Paschall
(74) *Attorney, Agent, or Firm* — Portland IP Law LLC

(57) ABSTRACT

Provided is a plasma processing apparatus including a chamber, a lower electrode, an upper electrode, and a substrate sensor. The chamber is configured to provide a reaction space. The lower electrode is disposed at a lower region in the chamber to mount a substrate thereon. The upper electrode is disposed at an upper region in the chamber to be opposite to the lower electrode. The substrate sensor is provided on the chamber to sense the substrate. Herein, the upper electrode includes an electrode plate and an insulating plate attached on the bottom of the electrode plate, and at least one guide hole is formed in the upper electrode to guide light output from the substrate sensor toward the substrate.

12 Claims, 7 Drawing Sheets

FOREIGN PATENT DOCUMENTS

| | | |
|---|---|---|
| JP | 2002-009043 | 1/2002 |
| JP | 2003-155569 | 5/2003 |
| JP | 18-278821 | 10/2006 |
| JP | 2006-319043 | 11/2006 |
| KR | 1020020080955 | 10/2002 |
| KR | 1020030072520 | 9/2003 |
| KR | 20-0349874 | 5/2004 |
| KR | 2005-0058168 | 6/2005 |
| KR | 2006-0009772 | 2/2006 |
| KR | 1020060013440 A | 2/2006 |
| KR | 10200600113440 A | 2/2006 |
| KR | 100742126 B1 | 7/2007 |
| TW | 440953 | 6/2001 |
| TW | 443078 | 6/2001 |
| TW | 200639497 | 11/2006 |
| WO | 2004-100247 A1 | 11/2004 |

\* cited by examiner

PLASMA PROCESSING APPARATUS

CROSS-REFERENCE TO RELATED APPLICATION

This application claims priority to Korean Patent Application No. 10-2008-0031042 filed on Apr. 3, 2008 and all the benefits accruing therefrom under 35 U.S.C. §119, the contents of which are incorporated by reference in their entirety.

BACKGROUND

The present disclosure relates to a plasma processing apparatus, and more particularly, to a plasma processing apparatus for removing various impurities deposited on a substrate.

A semiconductor device and a flat panel display device are fabricated through a deposition process and an etching process. That is, a semiconductor device and a flat panel display device are fabricated by forming a thin layer on a predetermined region of a substrate through a deposition process and forming desired circuit patterns or circuit devices on the substrate by removing an unnecessary portion of the thin layer through an etching process using an etch mask.

However, since the thin layer is formed on the entire front surface of the substrate during the deposition process and then only a portion of the thin layer formed on a center region of the substrate is destined for an etch target during the etching process, a portion of the thin layer corresponding to an edge region of the substrate remains unremoved. Also, by-products of the process, for example, particles are inevitably deposited during the etching process. Also, generally, since the substrate is mounted on a substrate support using an electrostatic force or a vacuum force, the substrate and the substrate support are spaced apart from each other by a predetermined distance to generate a gap, and a thin layer and particles can be deposited on the rear surface of the substrate through this gap. When subsequent processes are performed without removing the particles and thin layers deposited on the substrate, the substrate may be deformed or the alignment of the substrate becomes difficult.

Therefore, a plasma processing apparatus for etching/removing the particles and thin layers deposited on the edge region of the substrate is under development recently. In such a plasma processing apparatus, a substrate is mounted on a substrate support having a smaller diameter than the substrate to expose the edge region of the substrate, and upper and lower electrodes are disposed in an upper and lower sides of the edge region of the substrate to generate plasma on the exposed edge region of the substrate. Penetration of plasma toward the center region of the substrate is prevented by decreasing a gap between the substrate support and a plasma blocking unit disposed on the upper region of the substrate.

However, according to the above-described conventional method, the substrate is seated on the substrate support having a smaller diameter than the substrate, and the exposed edge region of the substrate is etched using plasma to remove particles that are deposited on the edge part, i.e., edges of the top and rear surfaces of the substrate and the side surface of the substrate. Therefore, the particles deposited on the center of the rear surface of the substrate can't be completely removed using the conventional method. Further, according to the conventional method, there is not provided a separate substrate sensor for accurately controlling the gap between the upper electrode and the substrate support and the alignment of the substrate seated on the substrate support. Even if the substrate sensor is provided, light output from the substrate sensor is obstructed by the upper electrode. Thus, the conventional method frequently causes the misalignment of the substrate.

SUMMARY

The present disclosure provides a plasma processing apparatus capable of more accurately controlling various operations through accurate substrate sensing to maximize the process efficiency by forming a guide hole for guiding light of a substrate sensor in an upper electrode which is disposed in an upper region inside a chamber so that an operation of the substrate sensor is not interfered by the upper electrode.

The present disclosure also provides a plasma processing apparatus capable of effectively removing particles and deposits that are present not only on upper and lower edges and a side surface of a substrate but also on an entire backside of the substrate. To this end, a lower electrode includes a plurality of electrodes, and the electrodes are alternately lifted up and down on a group-by-group basis, so that the entire backside of the substrate can be exposed.

In accordance with an exemplary embodiment, a plasma processing apparatus includes: a chamber configured to provide a reaction space; a lower electrode, on which a substrate is seated, disposed at a lower region in the chamber; an upper electrode facing the lower electrode and disposed at an upper region in the chamber; and a substrate sensor provided in the upper region of the chamber to sense the substrate, wherein the upper electrode includes an electrode plate and an insulating plate attached on the bottom of the electrode plate, and at least one guide hole is formed in the upper electrode to guide light output from the substrate sensor toward the substrate.

The electrode plate may include a sidewall protruding downwardly along the edge, and the insulating plate may be provided in an inside space defined by the sidewall.

The guide hole may be formed to vertically penetrate the sidewall, a region between the sidewall and the insulating plate, or both of the electrode plate and the insulating plate.

The guide hole may include an upper inlet and a lower outlet of which diameters are larger than an inner diameter.

The substrate sensor and the guide hole may be provided on a vertical line corresponding to the edge of the substrate.

The lower electrode may include a plurality of electrodes.

The plurality of electrodes may be concentric and spaced apart from each other by a predetermined distance.

The plurality of electrodes may belong to one of two groups each of which receives one of an RF voltage and a ground voltage, and moves up and down on a group-by-group basis.

The RF voltage may be controlled within the range of approximately 400 KHz to approximately 100 MHz.

The RF voltage may have a dual frequency.

The diameter of the lower electrode may be larger than the diameter of the substrate.

The plasma processing apparatus may further include: a lower lift coupled with the lower electrode to lift up/down the lower electrode; and an upper lift coupled with the upper electrode to lift up/down the upper electrode.

In accordance with another exemplary embodiment, a plasma processing apparatus includes: a chamber; an insulating plate provided in an upper region in the chamber; a ground electrode provided on a sidewall of the chamber and supplied with a ground voltage; and a lower electrode, on which a substrate is seated, disposed in a lower region in the chamber, wherein the lower electrode includes a plurality of electrodes, and an RF voltage and the ground voltage are alternately supplied to the adjacent two electrodes, respectively.

The electrode(s) to which the RF voltage is applied may be fixed, and the other electrode(s) may be driven to move up and down.

The electrode(s) to which the ground voltage is applied may be fixed, and the other electrode(s) may be driven to move up and down.

The electrodes of the lower electrode may be concentric and spaced apart from each other by a predetermined distance.

The electrodes of the lower electrode may include first, second and third electrodes arranged from the center toward the periphery of the substrate, the diameter of the first electrode may be approximately 35 to 55% of the diameter of the third electrode, and the diameter of the second electrode may be approximately 56 to 75% of the diameter of the third electrode.

The electrodes of the lower electrode may include first, second, third and fourth electrodes arranged from the center toward the periphery of the substrate. The diameter of the first electrode may be approximately 35 to 45% of the diameter of the fourth electrode, the diameter of the second electrode may be approximately 46 to 60% of the diameter of the fourth electrode, and the diameter of the third electrode may be approximately 61 to 75% of the diameter of the fourth electrode.

The electrodes of the lower electrode may include first, second, third, fourth and fifth electrodes arranged from the center toward the periphery of the substrate. The diameter of the first electrode may be approximately 30 to 40% of the diameter of the fifth electrode, the diameter of the second electrode is approximately 41 to 50% of the diameter of the fifth electrode, the diameter of the third electrode may be approximately 51 to 60% of the diameter of the fifth electrode, and the diameter of the fourth electrode may be approximately 61 to 75% of the diameter of the fifth electrode.

The plasma processing apparatus may further include a substrate sensor provided on the chamber to sense the substrate, wherein at least one guide hole may be formed in the insulating plate to guide light output from the substrate sensor toward the substrate.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
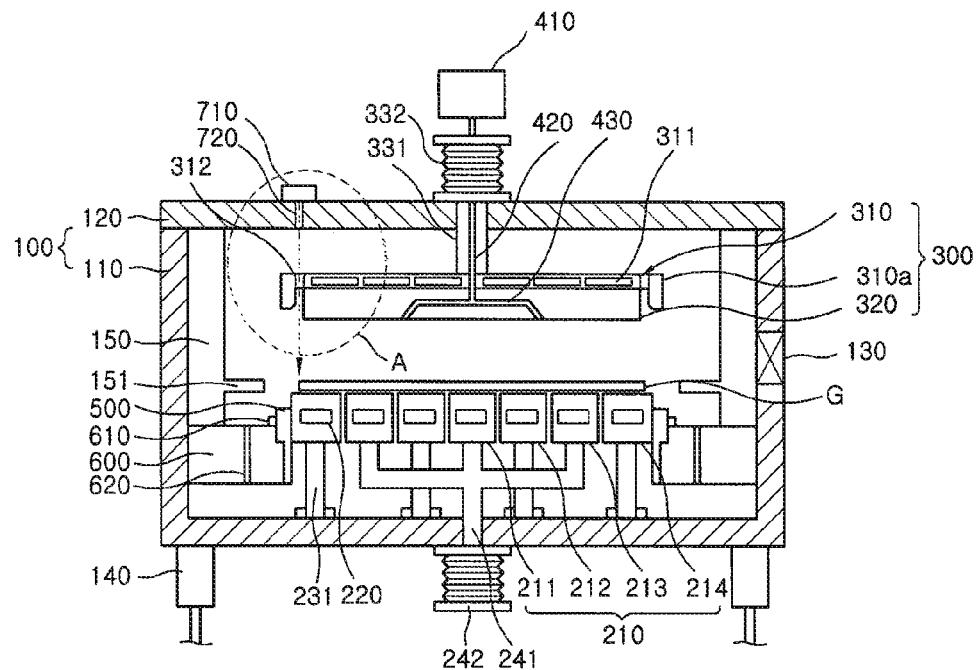
FIG. 1 is a sectional view of a plasma processing apparatus in accordance with a first exemplary embodiment.

Hereinafter, specific embodiments will be described in detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In every possible case, like reference numerals refer to like elements throughout the drawings.

Embodiment 1

Figure 2:
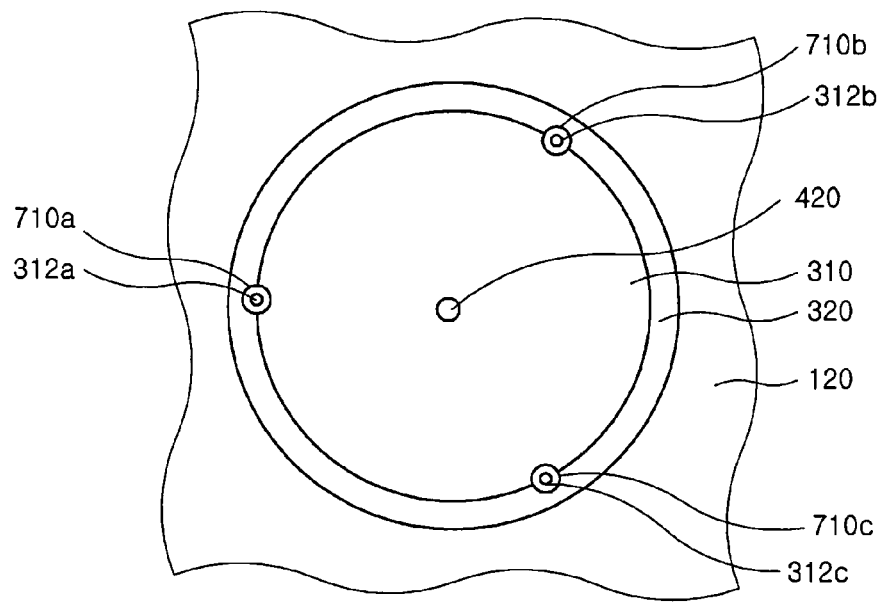
FIG. 2 is a sectional view of an upper electrode shown in FIG. 1.
Figure 3:
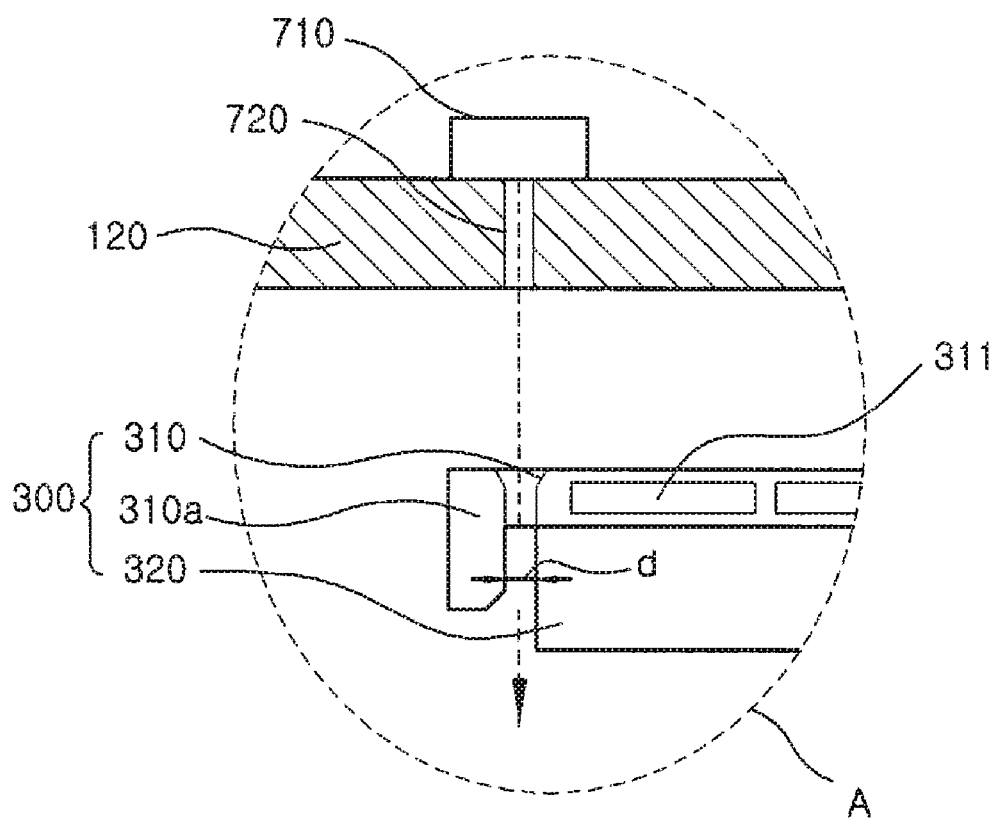
FIG. 3 is a partial enlarged view illustrating a region A in FIG. 3.
Figure 4:
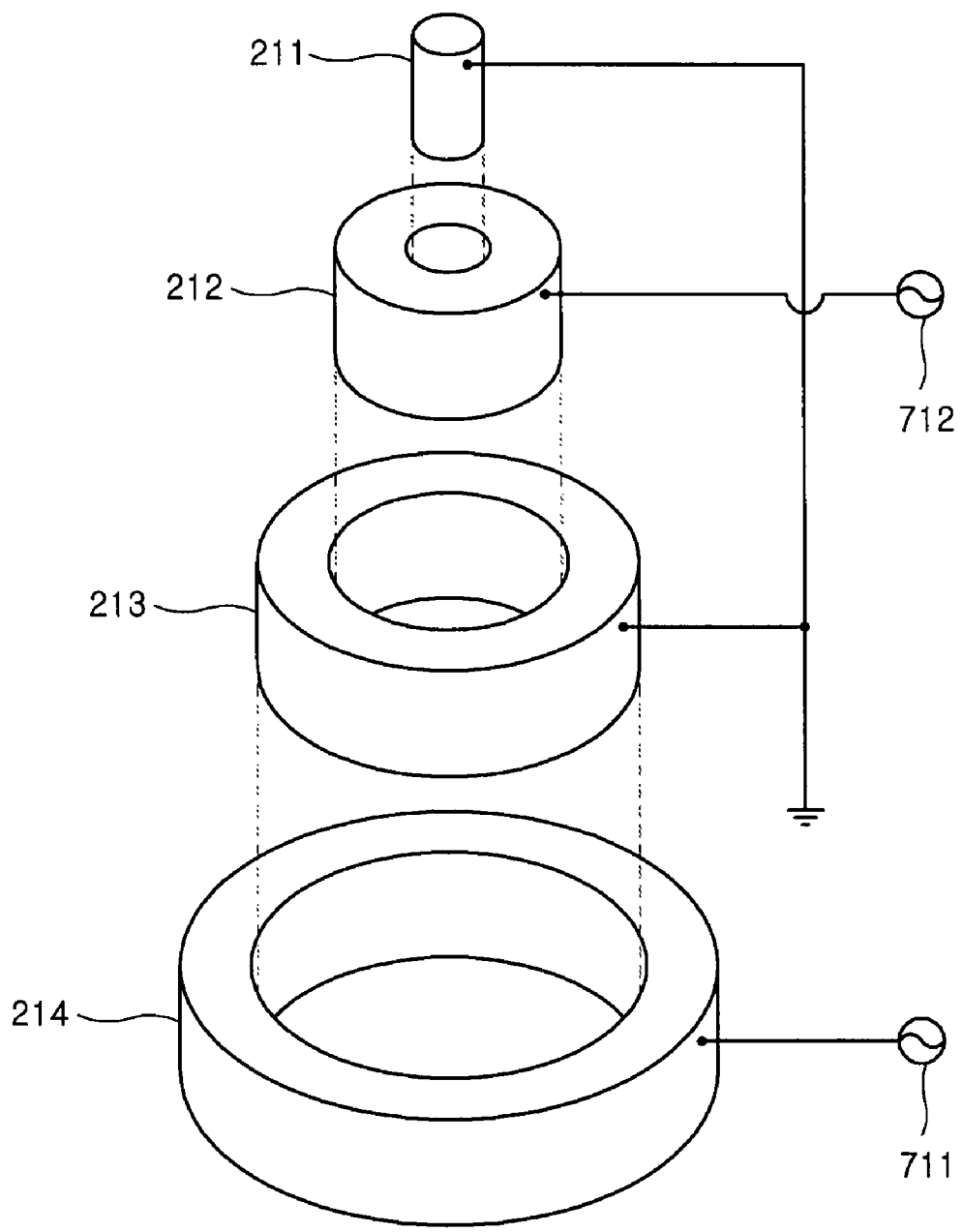
FIG. 4 is an exploded perspective view of a lower electrode shown in FIG. 1.

FIG. 1 is a sectional view of a plasma processing apparatus in accordance with an exemplary embodiment. FIG. 2 is a sectional view of an upper electrode shown in FIG. 1. FIG. 3 is a partial enlarged view illustrating a region A in FIG. 3. FIG. 4 is an exploded perspective view of a lower electrode shown in FIG. 1.

Referring to FIGS. 1 through 4, a plasma processing apparatus in accordance with the exemplary embodiment includes: a chamber 100; a lower electrode 210 which is disposed at a lower region in the chamber 100 and on which a substrate G is seated; a lower lift 241 coupled with the lower electrode 210 to lift up/down the lower electrode 210; an upper electrode 300 facing the lower electrode 210 and disposed at an upper region in the chamber 100; and an upper lift 331 coupled with the upper electrode 300 to lift up/down the upper electrode 300. Also, the plasma processing apparatus in accordance with the exemplary embodiment may further include: a chamber liner 150 formed on an inner sidewall of the chamber 100; a focus ring 500 provided along an outer periphery of the lower electrode 210; and a vent plate 600 provided between the outer periphery of the lower electrode 210 and an inner surface of the chamber 100.

The chamber 100 is formed of aluminum having an anodized surface. The chamber 100 includes: a lower chamber 110; and a chamber lid 120 covering a top portion of the lower chamber 110. The lower chamber 110 is formed in a shape of a cylinder with an open top portion, and the shape of the lower chamber 110 may vary depending on the shape of a glass substrate or a semiconductor wafer. The chamber lid 120 serves to close an open top portion of the lower chamber 110, and tightly contacts the top portion of the lower chamber 110 to form a predetermined space in the chamber 100.

A gas supply channel 420 is provided at a top portion of the chamber 100 to vertically penetrate a top wall of the chamber 100 so that a first gas can flow into the chamber 100. A first gas supply unit 410 is connected with the gas supply channel 420. Thus, the first gas flows from the first gas supply unit 410 through the gas supply channel 420 into the chamber 100. Herein, the first gas may include one of Ar, CF4, C12, SF6, BCl3, and a combination thereof. A gate 130 is provided at a sidewall of the chamber 100 so that the substrate G can be loaded into the chamber 100 therethrough. The gate 130 is opened and closed to load the substrate G to be processed into the chamber and to unload the processed substrate G out of the chamber. An exhaust unit 140 is provided under a bottom portion of the chamber 100. The exhaust unit 140 exhausts reaction gases and reaction by-products (e.g., particles) generated during an etching process out of the chamber 100. Herein, the exhaust unit 140 may be formed under the sidewall as well as under the bottom portion of the chamber 100.

The chamber liner 150 is installed on the inner sidewall of the chamber 100 to protect the inner sidewall of the chamber 100 from plasma. The chamber liner 150 is formed in a shape of a hollow cylinder having a predetermined space in the center region. The chamber liner 150 is installed such that its outer side covers the inner sidewall of the chamber 100. Also, a ring-shaped protrusion 151 is provided at a predetermined height on an inner side of the chamber liner 150. The protrusion 151 extends toward the center of the chamber 100, and a ground voltage is applied to the protrusion 151. Accordingly, plasma generated near the protrusion 151 can be concentrated on the upper/lower edge regions of the substrate G.

The upper electrode 300 is provided in the upper region of the chamber 100. The upper electrode 300 includes: an upper electrode plate 310 formed of a conductive material such as aluminum (Al); and a lower insulating plate 320 formed of an insulating material such as ceramic.

The electrode plate 310 is formed in a shape of a cylinder having a sidewall 310a extending downward along its edge. A gas supply hole (not shown) is formed at the center of the electrode plate 310 to communicate with the gas supply channel 420. The center of a top surface of the electrode plate 310 is coupled with the upper lift 331 and thus the electrode plate 310 is mounted on an inner top wall of the chamber 100, so that the electrode plate 310 can move up and down within a predetermined range. Herein, a sealing means such as a bellows 332 may be provided at a connection region between the upper lift 331 and the chamber 100 in order to maintain a sealing state of the chamber 100. Also, a cooling channel 311 for controlling the temperature of the upper electrode 300 is provided in the electrode plate 310, and a coolant supply unit (not shown) is connected with the cooling channel 311. Thus, a coolant supplied from the coolant supply unit circulates through the cooling channel 311 to prevent a sudden increase of temperature of the upper electrode 300, so that damage of the insulating plate 320 can be prevented. Of course, the cooling channel 311 may be provided in the insulating plate 320. Meanwhile, the ground voltage is applied to the electrode plate 310, and the electrode plate 310 functions as a ground electrode. Therefore, it is not necessary to provide a separate ground electrode (see 840 in FIG. 7) on the inner sidewall of the chamber 100, and the structure of the chamber 100 may be further simplified.

The insulating plate 320 is inserted in an inner space defined by the sidewall 310a of the electrode plate 310. The insulating plate 320 serves as both a gas injection plate for injecting gas onto a top surface of the substrate G and a plasma blocking plate for preventing generation of plasma on the top surface of the substrate G. A gas injection hole 430 is formed in the insulating plate 320 so that the insulating plate 320 can serve as the gas injection plate. An upper inlet of the gas injection hole 430 communicates with the gas supply channel 420 and a lower outlet of the gas injection hole 430 is open toward the substrate G. The gas injection hole 430 may include a plurality of gas injection holes branching from the gas supply channel 420 so that the injection pressure is uniformly distributed. The lower outlet direction of the gas injection hole 430 may be inclined toward the outside so that the injected gas flows from the center toward the edge of the substrate G. Of course, the gas injection hole 430 may have any shape as long as it can inject gas toward the substrate G. For example, an insulating plate 320 may have a configuration in which the insulating plate is coupled with an electrode plate 310 and includes a main insulating plate having a groove formed at its bottom center and a sub insulating plate coupled to the groove of the main insulating plate, so that the spaces between the main insulating plate and the sub insulating plate can form a gas injection hole 430.

Meanwhile, a substrate sensor 710 for sensing the substrate G is installed on a top wall of the chamber 100. Specifically, the substrate sensor 710 may be installed at a vertical position corresponding to an edge portion of the substrate G. In this embodiment, a transparent region 720 is formed at a portion of the top wall of the chamber 100, and then three laser sensors 710a, 710b, 710c are installed along a circumferential region corresponding to the edge of the substrate G so that they are spaced apart from each other by the same distance. Of course, the number of the substrate sensor 710 may be more than three or less than three. Also, three guide holes 312a, 312b, 312c for guiding light of the laser sensors 710a, 710b, 710c are formed at the edge of the upper electrode 300. Specifically, the guide holes 312a, 312b, 312c may be formed between the insulating plate 320 and the sidewall 310a protruding downwardly along the edge of the electrode plate 310. Alternatively, the guide holes 312a, 312b, 312c may be formed to penetrate through only the sidewall 310a of the electrode plate 310 or both of the electrode plate 310 and the insulating plate 320. The laser sensors 710a, 710b, 710c, the transparent region 720, and the guide holes 312a, 312b, 312c are concentric on the vertical line corresponding to the edge portion of the substrate G. The number of the guide holes 312a, 312b, 312c may be equal to the number of the laser sensors 710a, 710b, 710c. The laser sensors 710a, 710b, 710c emit a light having a predetermined wavelength and receive light reflected by the substrate G to provide information on substrate position for controlling the alignment of the substrate G and distance between the upper electrode 300 and the lower electrode 210. In general, the light emitted from the laser sensors 710a, 710b, 710c disperses with distance and thus the sensitivity may be degraded. However, according to this embodiment, the guide holes 312a, 312b, 312c are formed in the upper electrode 300 to concentrate the light from the laser sensors 710a, 710b, 710c, and thereby the degradation of the sensitivity can be prevented. Herein, the diameters of the upper inlets and the lower outlets of the guide holes 312a, 312b, 312c may be larger than the inner diameters in order not to obstruct the proceeding paths of the light emitted from the laser sensors 710a, 710b, 710c and the light reflected by the substrate G. The diameter d of the guide hole may be in a range of approximately 0.1 mm to approximately 0.5 mm. Of course, the cross sections of the guide holes 312a, 312b, 312c may be any shape such as polygonal and slot shapes as well as the circular shape as long as light can pass therethrough.

The lower electrode 210 serves as both a radio frequency (RF) electrode for supplying RF voltages 711, 712 and a substrate support on which the substrate G is seated. The lower electrode 210 may be circular or polygonal. Specifically, the lower electrode 210 may be circular or polygonal depending on whether the substrate G is a semiconductor wafer or a glass substrate for a flat display panel. Further, the lower electrode 210 may have a larger diameter than the substrate G. In this way, the plasma density of the edge region of the substrate G can be increased, and therefore the plasma processing efficiency can be increased. Also, the entire rear region of the substrate G can be supported to prevent deformation of the substrate G.

The lower electrode 210 includes a plurality of electrodes 211, 212, 213, 214. Specifically, the lower electrode 210 includes: a central electrode 211 disposed corresponding to the center of the substrate G; and one or more peripheral electrodes 212, 213, 214 surrounding the central electrode 211 and have different diameters. Herein, the central electrode 211 may have a shape of a circular or polygonal column or a shape of a circular or polygonal ring. The peripheral electrodes 212, 213, 214 may have shapes of circular or polygonal rings with different diameters. For example, a first electrode 211 having a shape of a circular column is disposed corresponding to the center of the substrate G, and second, third and fourth electrode 212, 213, 214 having a shape of circular ring are disposed around the first electrode 211 in ascending order of diameters. Herein, the lower electrodes 211, 212, 213, 214 are concentric and spaced apart from each other by a predetermined distance. Also, the lower electrodes 211, 212, 213, 214 may belong to one of two groups. The lower electrodes in each group may receive one of the ground voltage and the RF voltage 711/712, and move up and down on a group-by-group basis. For example, the ground voltage is applied to the first electrode 211 and the third electrode 213 which are odd-numbered from the center to the periphery of the substrate G, and the first and third electrodes 211, 213 are connected with the lower lift 241. Also, the RF voltages 711, 712 are applied to the rest of the electrodes, i.e., the second and fourth electrodes 212, 214, and the second and fourth electrodes 212, 214 are connected with a support 231 and thus fixed to the bottom wall of the chamber 100. Accordingly, the relative position of the first and third electrode 211, 213 with respect to the second and fourth electrodes 212, 214 is changed with the up/down movement of the lower lift 241. Thus, the substrate G can be supported by all the electrodes 211, 212, 213, 214 or by some electrodes 211, 213 or 212, 214, so that exposed region of the rear surface of the substrate G can be changed. Therefore, a process can be performed with changing the exposed region of rear surface of the substrate G.

Of course, the power configuration and the lift up/down configuration of the lower electrode 310 are not limited to the above-described configurations. The opposite configuration may be employed and the respective electrodes 211, 212, 213, 214 may be lifted up/down in other manners as long as the voltage configurations and the lift up/down configurations of the respective electrodes 211, 212, 213, 214 can be controlled on a group-by-group basis. Also, the RF voltages 711, 712 applied to the lower electrode 210 may be controlled within the range of approximately 400 KHz to approximately 100 MHz to control the plasma processing operation. That is, the plasma generating temperature decreases with an increase of the frequency of the RF voltage 711/712, whereby the plasma processing operation can be controlled. The RF voltages 711, 712 may have a single frequency or have a dual frequency, for example, a high frequency and a low frequency. When the RF voltages 711/712 have a dual frequency, the etch profile in a vertical direction can be controlled, whereby more suitable plasma processing can be performed depending on the substrate state.

Although the lower electrode 210 is divided into four electrodes 211, 212, 213, 214 in the above-described embodiment, the present invention is not limited thereto. That is, the number of the lower electrodes may be smaller or larger than four. Herein, the outer electrode may have a larger diameter than the inner electrode in order to stably support the substrate and to prevent deformation of the substrate. For example, if the lower electrode includes first, second and third electrodes disposed from the center to the outside, the diameter of the first electrode may be approximately 35 to 55% of the diameter of the outermost electrode (i.e., the third electrode) and the diameter of the second electrode may be approximately 56 to 75% of the diameter of the outermost electrode. If the lower electrode includes first, second, third and fourth electrodes disposed from the center to the outside, the diameter of the first electrode may be approximately 35 to 45% of the diameter of the outermost electrode (i.e., the fourth electrode), the diameter of the second electrode may be approximately 46 to 60% of the diameter of the outermost electrode, and the diameter of the third electrode may be approximately 61 to 75% of the diameter of the fourth electrode. If the lower electrode includes first, second, third, fourth and fifth electrodes disposed from the center to the outside, the diameter of the first electrode may be approximately 30 to 40% of the diameter of the outermost electrode (i.e., the fifth electrode), the diameter of the second electrode may be approximately 41 to 50% of the diameter of the outermost electrode, the diameter of the third electrode may be approximately 51 to 60% of the diameter of the outermost electrode, and the diameter of the fourth electrode may be approximately 61 to 75% of the diameter of the outermost electrode.

Although not shown in the drawings, one end of the lower lift 241 penetrates the bottom wall of the chamber 100 and is connected with a driving means (e.g., a stepping motor) provided at the outside of the chamber 100, so that the lower lift 241 can move up and down. Herein, a sealing means such as a bellows 242 may be provided at a connection region between the lower lift 241 and the chamber 100 to secure a sealing state of the chamber 100. Also, the lower lift 241 and the driving means may be any members capable of lifting up/down the lower electrode 210. For example, the lower lift 241 and the driving means may be one of a pneumatic or hydraulic cylinder, a liner motor (LM) guide, and a combination thereof.

Also, a chuck (not shown) for supporting the substrate G may be further provided on the lower electrode 210. The chuck may be an electrostatic chuck. However, the present invention is limited thereto, but a vacuum force or a mechanical force may be used to support the substrate G in an absorbing manner. Also, a cooling channel 220 for temperature control is provided in the lower electrode 210, and a coolant supply unit (not shown) may be connected with the cooling channel 220, so that the temperature of the lower electrode 210 can be controlled suitably. Also, a helium channel (not shown) may be further provided in the lower electrode 210, so that the temperature of the substrate G can be controlled using helium supplied through the helium channel.

The focus ring 500 is formed in a shape of a ring and is provided along the outer periphery of the lower electrode 210. When gas supplied into the chamber 100 changes into plasma, the focus ring 500 serves to concentrate the plasma onto the substrate G to increase the reaction efficiency.

The vent plate 600 is fabricated in a shape of a circular plate having a central portion opened vertically, and a plurality of gas exhaust holes 620 spaced apart from each other by the same distance along the circumferential direction is formed to vertically penetrate the vent plate 600. Also, the vent plate 600 is provided between the lower electrode 210 and the inner surface of the chamber 100. Specifically, the vent plate 600 is formed to connect between the outer periphery of the focus ring 500 and the inner sidewall of the chamber 100, thereby partitioning the inside space of the chamber 100 into an upper space and a lower space. The vent plate 600 controls the pressure so that the first gas injected into the chamber 100 is uniformly distributed in the chamber 100. Therefore, local concentration of the plasma generated in the chamber 100 can be prevented. Meanwhile, a protruding electrode 610 may be further provided on one surface of the vent plate 600, i.e., the top surface of the vent plate 600. Thus, the vent plate 600 can control the pressure of the chamber 100 to be uniform and also can serve as an electrode to which the ground voltage is applied. Herein, the protruding electrode 610 may be formed integrally with or separately from the vent plate 600. If the protruding electrode 610 is formed separately from the vent plate 600, the ground voltage may be separately applied to the vent plate 600 and the protruding electrode 610. Of course, the ground voltage may be simultaneously applied to the vent plate 600 and the protruding electrode 610.

Hereinafter, a method for removing particles and deposits present on the upper/lower edges, the side surfaces, and the rear surface of the substrate by using the above-described plasma processing apparatus in accordance with the present embodiment will be described.

Figure 5:
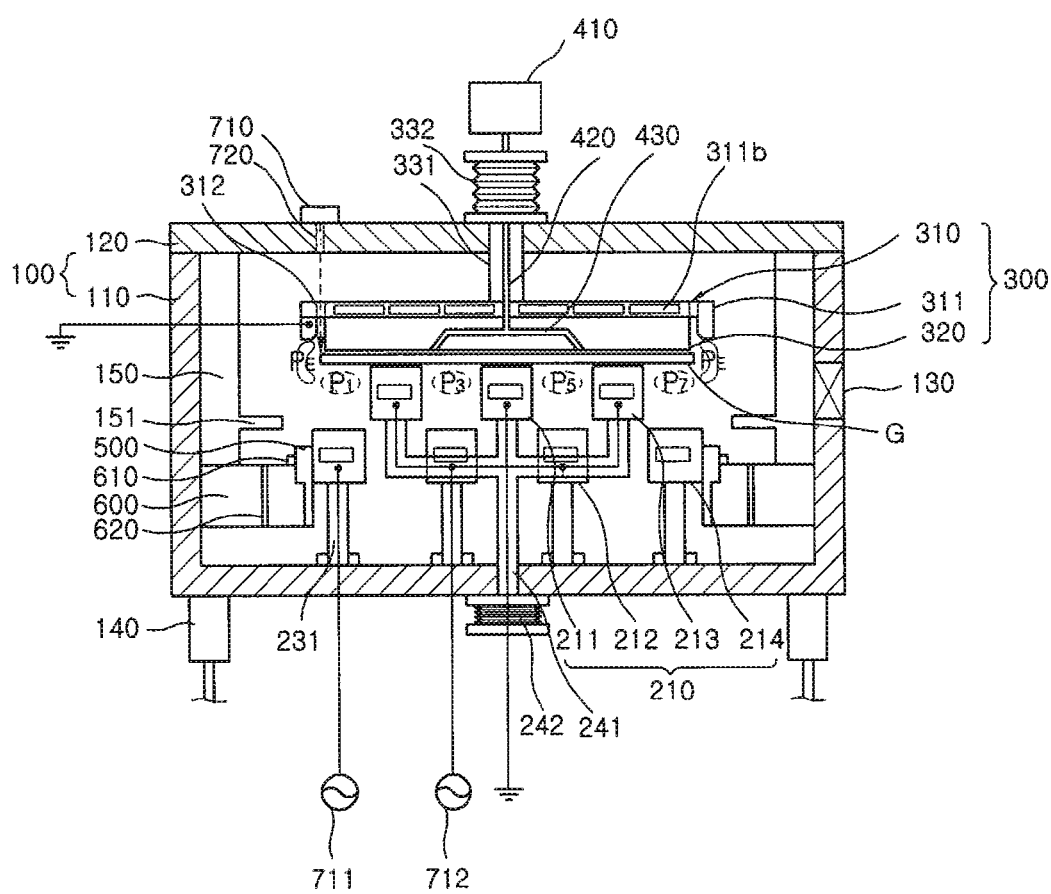
FIG. 5 is a schematic view of a chamber for illustrating a first processing operation of the plasma processing apparatus in accordance with the first exemplary embodiment.
Figure 6:
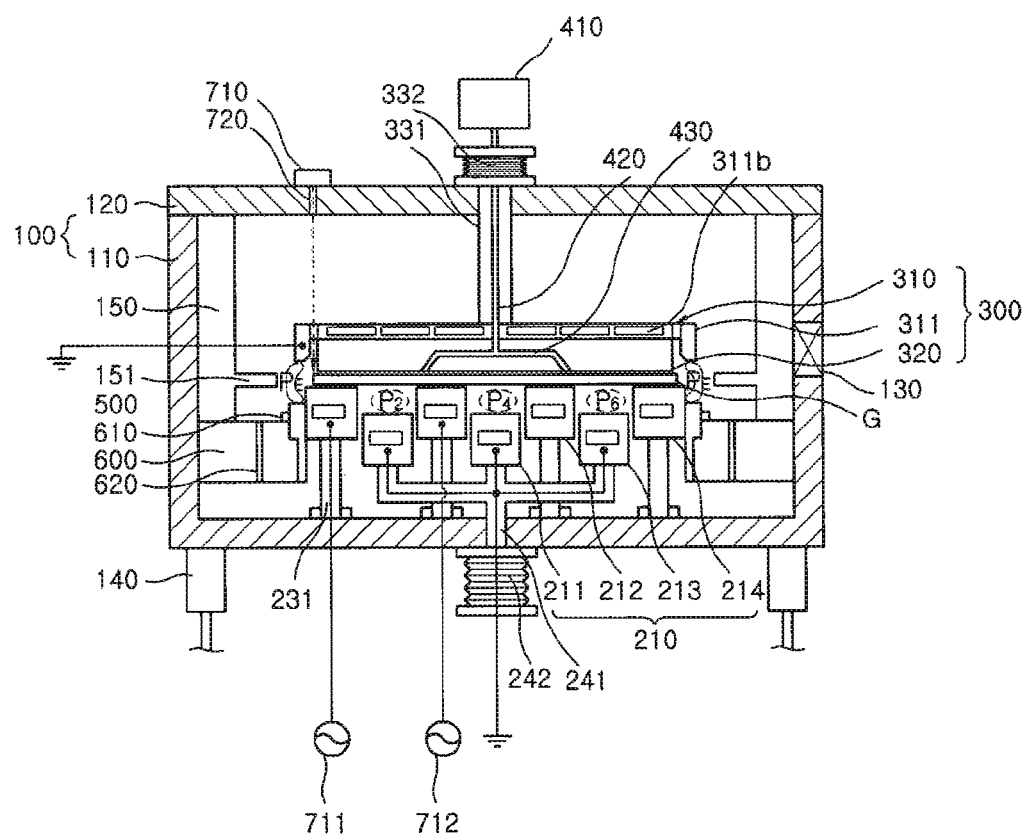
FIG. 6 is a schematic view of the chamber for illustrating a second processing operation of the plasma processing apparatus in accordance with the first exemplary embodiment.

FIG. 5 is a schematic view of a chamber for showing a first processing operation of the plasma processing apparatus in accordance with an exemplary embodiment. FIG. 6 is a schematic view of the chamber for illustrating a second processing operation of the plasma processing apparatus in accordance with the first exemplary embodiment.

First, when the substrate G is loaded into the chamber 100 by a substrate carrying means, the first electrode 211 and the third electrode 213 are lifted up by the lower lift 241, so that the substrate G is loaded onto their top surfaces. At this point, the position of the substrate G is sensed by the substrate sensor 710 installed on the chamber 100 and sensed position information of the substrate G is provided to the substrate carrying means, so that the substrate G can be disposed at a desired position, i.e., the center of the lower electrode 210.

Thereafter, as shown in FIG. 5, in the first processing operation, the first electrode 211 and the third electrode 213 are further lifted up by the lower lift 241 such that they are spaced apart from the upper electrode 300 by a predetermined distance. Thereafter, a process gas from the gas supply unit 410 flows through the gas supply channel 420 into the insulating plate 320, and thus the process gas is injected onto the substrate G through the gas injection hole 430 formed in the insulating plate 320. The process gas may include: a reaction gas for removing deposits on the substrate G; and an inert gas. Simultaneously with or after the injection of the process gas, the ground voltage is applied to the electrode plate 310, the first electrode 211 and the third electrode 213, and the RF voltages 711, 712 are applied to the second electrode 212 and the fourth electrode 214, thereby plasma is generated. At this point, the distance between the insulating plate 320 and the substrate G is maintained at, for example, approximately 1 mm or less not to activate plasma. Therefore plasma is not generated on the center of the top surface of the substrate G, and plasmas PE, P1, P3, P5, P7 are generated on the upper edge region, the side regions, and the rear surface region of the substrate G. Specifically, the plasmas PE, P1, P3, P5, P7 are generated in a space surrounded by the electrode plate 310, the first electrode 211 and the third electrode 213 to which the ground voltage is applied. As such, particles and deposits that are present in the exposed substrate regions, i.e., the upper edge region and the side regions (PE) of the substrate G and some of the rear surface region of the substrate G (i.e., the region between the first electrode 211 and the third electrode 213) (P1, P3, P5, P7) are removed.

On the other hand, as shown in FIG. 6, in the second processing operation, the first electrode 211 and the third electrode 213 are lifted down by the lower lift 241 to be lower than the second electrode 212 and the fourth electrode 21, so that the substrate G is seated on the second electrode 212 and the fourth electrode 214. Meanwhile, the upper electrode 300 is lifted down by the upper lift 331 so that it is spaced apart by a predetermined distance from the second electrode 212 and the fourth electrode 214 that are provided at a lower space in the chamber 100. Thereafter, a first gas supplied from the gas supply unit 410 flows through the gas supply channel 420 into the insulating plate 320, and thus the first gas is injected onto the substrate G through the gas injection hole 430 formed in the insulating plate 320. Simultaneously with or after the injection of the first gas, the ground voltage is applied to the electrode plate 310, the first electrode 211 and the third electrode 213, and the RF voltages 711, 712 are applied to the second electrode 212 and the fourth electrode 214 to generate plasma. At this point, the RF voltages 711, 712 may be within the range of approximately 400 KHz to approximately 100 MHz. Also, the distance between the insulating plate 320 and the substrate G is maintained at, for example, approximately 1 mm or less not to activate plasma. Therefore, plasma is not generated on the center of the top surface of the substrate G, and plasmas PE, P2, P4, P6 are generated on the upper edge region, the side regions, and the rear surface region of the substrate G. Specifically, the plasmas PE, P2, P4, P6 are generated in a space surrounded by the electrode plate 310, the second electrode 212 and the fourth electrode 214. The RF voltages are applied to the second electrode 212 and the fourth electrode 214. As such, particles and deposits that are present in the exposed substrate regions, i.e., the top edge region and the side regions (PE) of the substrate G and some of the rear surface region of the substrate G (i.e., the region between the second electrode 212 and the fourth electrode 214) (P2, P4, P6) are removed.

Meanwhile, after completion of the first and second processing operations, the first electrode 211 and the third electrode 213 is again lifted up by the lower lift 241, so that the substrate G is again seated on their top surfaces. Thereafter, the substrate G is unloaded by the substrate carrying means to the outside of the chamber 100.

In this way, the plasma processing apparatus in accordance with the present embodiment performs the above-described first and second processing operations to remove particles and deposits which are present in the upper/lower edge regions, the side region, and the rear surface region of the substrate G, while protecting the top surface of the substrate G. Also, since the substrate position can be detected by the substrate sensor 710, the alignment error of the substrate G can be further reduced and also the distance between the upper electrode 300 and the lower electrode 210 can be controlled more accurately. Therefore, the process efficiency can be maximized. Also, the lower electrode 210 includes a plurality of electrodes 211, 212, 213, 214, and some of the electrodes (211, 213) are used to move the substrate G to the loading/unloading position. Therefore, the conventional substrate lifting means becomes unnecessary, and the structure of the lower electrode 210 can be further simplified. Also, since the lower electrode 210 includes a plurality of the electrodes 211, 212, 213, 214 and the ground voltage and the RF voltage are alternately applied to the electrodes 211, 212, 213, 214, plasma can be uniformly formed in a large area. Therefore, the present invention can be applied not only to small/medium-sized substrates but also to large-area substrates.

Embodiment 2

The plasma processing apparatus in accordance with the present invention is not limited to the above-described configurations, but various embodiments are possible. Hereinafter, a plasma processing apparatus in accordance with a second exemplary embodiment will be described as an example of the various embodiments. In describing this embodiment, an overlapping description will be omitted for conciseness.

Figure 7:
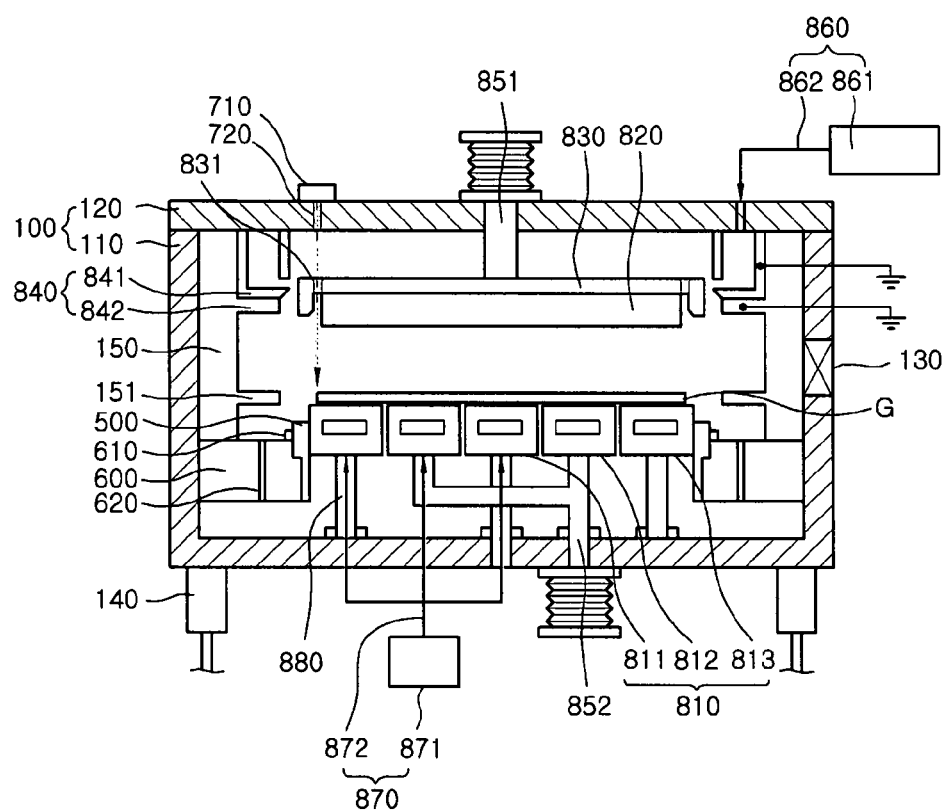
FIG. 7 is a sectional view of a plasma processing apparatus in accordance with a second exemplary embodiment.
Figure 8:
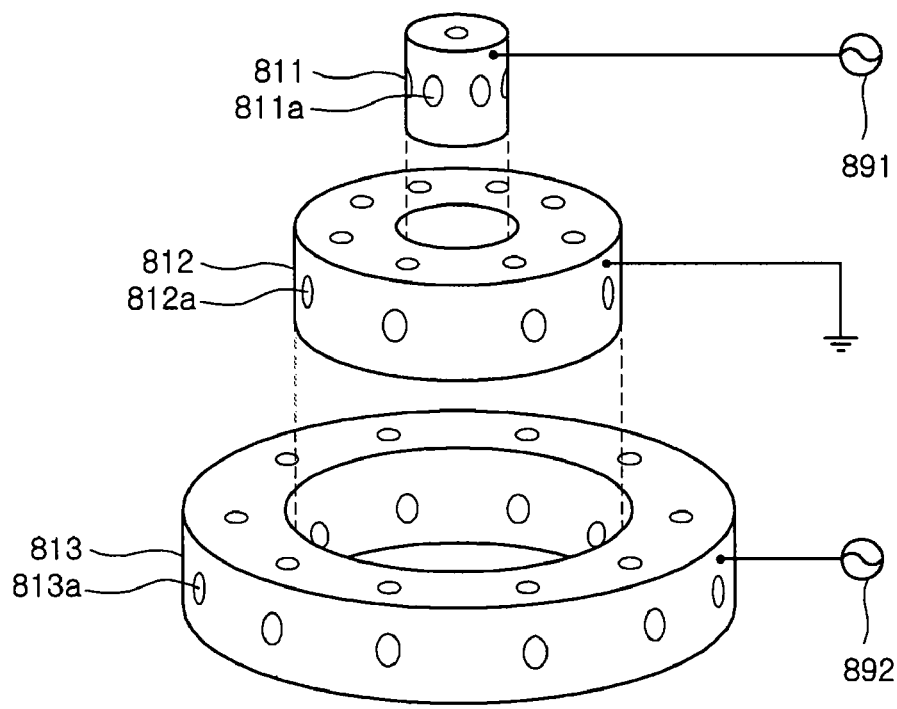
FIG. 8 is an exploded perspective view of a lower electrode shown in FIG. 7.

FIG. 7 is a sectional view of a plasma processing apparatus in accordance with the second exemplary embodiment. FIG. 8 is an exploded perspective view of a lower electrode shown in FIG. 7.

Referring to FIGS. 7 and 8, a plasma processing apparatus in accordance with the second exemplary embodiment includes: a chamber 100; an insulating plate 820 disposed at an upper region in the chamber 100; a ground electrode 840 provided at an upper portion of a sidewall of the chamber 100; a lower electrode 810 on which a substrate G is seated; an upper lift 851 configured to lift up/down the insulating plate 820; and a lower lift 852 configured to lift up/down the lower electrode 810. Also, the plasma processing apparatus may further include: a first gas supply means 860 configured to supply a first gas to the upper region in the chamber 100; and a second gas supply means 870 configured to supply a second gas through the lower electrode 810.

Herein, the first gas supply means 860 includes: a first gas supply unit 861 configured to store the first gas; and a first gas supply channel 862 configured to supply the first gas into the chamber 100. Also, the second gas supply means 870 includes: a second gas supply unit 871 configured to store the second gas; and a second gas supply channel 872 configured to supply the second gas to the lower electrode 810. Herein, the first gas supply means 860 may be any means that can supply the first gas into the chamber 100.

The insulating plate 820 is installed on a bottom surface of a support plate 830, and the center of a top surface of the support plate 830 is coupled with the upper lift 851 and installed at a top wall of the chamber 100, so that it can move up and down within a predetermined range. The support plate is formed in a shape of a cylinder having a sidewall protruding downward along the edge, and the insulating plate 820 is installed in an inner space defined by the sidewall. Also, a guide hole 831 for guiding light of a laser sensor 710 is installed at the edge of at least one of the support plate 830 and the insulating plate 820. Specifically, the guide hole 831 may be formed to penetrate the region between the insulating plate 820 and the sidewall of the support plate 830. Herein, the guide hole 831 may be formed to penetrate only the sidewall of the support plate 830 or to penetrate both of the support plate 830 and the insulating plate 820.

The ground electrode 840, which is provided at the upper portion of the sidewall of the chamber 100, is formed in a shape of a circular ring. The ground electrode 840 includes an inner electrode 841 and an outer electrode 842 that are grounded, respectively. The top of the inner electrode 841 is connected with the first gas supply channel 862 formed in the top wall of the chamber 100, and a predetermined space is provided inside the inner electrode 841. Also, a plurality of gas injection holes connected with the predetermined space is formed at one side of the sidewall of the inner electrode 841. That is, the first gas flows through the first gas supply channel 862 which is formed in the top wall of the chamber 100 into the predetermined space formed at the inside of the inner electrode 841. The first gas introduced into the predetermined space flows into the chamber 100 through the gas injection holes formed at the sidewall of the inner electrode 310. The outer electrode 842 is formed to be adjacent to an upper portion of the sidewall of the chamber 100, more specifically, to the bottom of the inner electrode 841. Thus, when the process is started, the ground electrode 840 is disposed to be adjacent to an edge region of the substrate G. That is, the ground electrode 840 is disposed at the end region of the substrate G in order to etch particles and deposits which are present in the top edge region, the side region, and the rear region of the substrate G, by using plasma. Meanwhile, the inner electrode 841 and the outer electrode 842 formed as a single electrode, and may be coated with a dielectric layer for protection.

The lower electrode 810 may be divided into a plurality of electrodes 811, 812, 813. RF voltages 891, 892 may be supplied to the electrodes 811, 813 which are odd-numbered from the center toward the periphery of the substrate G, and a ground voltage may be supplied to the other electrode 812. Herein, the electrodes 811, 813 to which the RF voltages 891, 892 are supplied may be fixed and the other electrode 812 may move up and down. For example, the lower electrode 810 includes: a first electrode 811 which has a shape of a circular pillar and is disposed corresponding to the center of the substrate G; and second and third electrodes 812, 813 that have a shape of a circular ring and are disposed around the first electrode 811 in an ascending order of diameters. Herein, the RF voltages 891, 892 are supplied to the first electrode 811 and the third electrode 813, and the ground voltage is supplied to the second electrode 812. Herein, the first and third electrodes 811, 813 to which the RF voltages 891, 892 are supplied are fixed by the respective support 880 to a bottom wall of the chamber 100, and the second electrode 812 is connected with the lower lift 852 to move up and down. Thus, the RF voltages 891, 892 can be stably supplied to the first electrode 811 and the third electrode 813, and some region of the rear surface of the substrate G and the remaining region can be alternately exposed according to the relative up/down movement of the second electrode 812. Therefore, particles and deposits that are present in the entire region of the rear surface of the substrate G can be removed. Although, in the above description, the lower electrode 810 is divided into three electrodes 811, 812, 813, the present invention is not limited thereto. That is, the lower electrode 810 may include four or more electrodes.

Also, a plurality of gas injection holes 811a, 812a, 813a is provided on the surfaces of the lower electrodes 811, 812, 813. That is, as illustrated in FIG. 8, a plurality of gas injection holes 811a, 812a, 813a is formed on the top surfaces and the side surfaces of the lower electrodes 811, 812, 813, and the gas injection holes 811a, 812a, 813a are connected with the second gas supply channel 872 to inject the second gas, provided from the second gas supply unit 871, toward the rear of the substrate G. Therefore, the second gas and can be supplied into the chamber 100 simultaneously with or separately from the first gas supplied to the inner upper region of the chamber 100, and thus a variety of process controls are possible. Of course, at least one of the first and second gases includes a reaction gas for removing particles on the substrate G, and they may use the same gas or different gases.

Although, RIE type plasma processing apparatuses having a plurality of lower electrodes are illustrated in the above-described embodiments, the present invention is not limited thereto. That is, the present invention may also be applied to various plasma processing apparatuses, such as inductive coupled plasma (ICP) processing apparatuses, capacitively coupled plasma (CCP) processing apparatuses, electron cyclotron resonance (ECR) processing apparatuses using microwaves, and surface wave plasma (SWP) processing apparatuses.

According to the present invention as described above, the guide hole for guiding light of the substrate sensor is provided at the edge of the upper electrode disposed at the upper region in the chamber, so that the position of the substrate can be accurately detected without obstruction by the upper electrode. Therefore, the alignment error of the substrate can be further reduced and the distance between the upper electrode and the lower electrode can be controlled more accurately, and thereby the process efficiency can be maximized.

Also, the lower electrode of the exemplary embodiments of the present invention includes a plurality of electrodes and the electrodes are alternately lifted up and down on a group-by-group basis, so that particles and deposits that are present not only on the top and bottom edges and the side surface of the substrate but also on the entire rear surface of the substrate can be effectively removed.

Also, the lower electrode of the exemplary embodiments of the present invention includes a plurality of electrodes and the ground voltage and the RF voltage are alternately supplied to the electrodes of the lower electrode, so that plasma can be uniformly formed in a large area. Therefore, the present invention can be applied not only to small/medium-sized substrates but also to large-area substrates.

Further, the lower electrode of the exemplary embodiments of the present invention includes a plurality of electrodes, and some of the electrodes move the substrate to loading/unloading position. Therefore, separate substrate lifting means is not necessary and the configuration of the lower electrode can be further simplified.

In addition, the upper electrode of the exemplary embodiments of the present invention includes the electrode plate and the insulating plate, and the edge of the electrode plate extends downward to function as a ground electrode. Therefore, a separate ground electrode on the inner sidewall of the chamber is not necessary and the configuration of the chamber can be simplified.

Although the plasma processing apparatus has been described with reference to the specific embodiments, it is not limited thereto but is defined by the appended claims. Therefore, it will be readily understood by those skilled in the art that various modifications and changes can be made thereto without departing from the spirit and scope of the present invention defined by the appended claims.

What is claimed is:

1. A plasma processing apparatus comprising:
   a chamber configured to provide a reaction space;
   a lower electrode, on which a substrate is to be seated, disposed at a lower region in the chamber;
   an upper electrode facing the lower electrode and disposed at an upper region in the chamber; and
   a substrate sensor provided in the upper region of the chamber to sense the substrate,
   wherein the upper electrode comprises an electrode plate and an insulating plate attached on the bottom of the electrode plate, and at least one guide hole is formed in the upper electrode to guide light output from the substrate sensor toward the substrate,
   wherein the substrate sensor and the guide hole are provided on a vertical line corresponding to the edge of the substrate.

2. The plasma processing apparatus of claim 1, wherein the electrode plate comprises a sidewall protruding downwardly along the edge, and the insulating plate is provided in an inside space defined by the sidewall.

3. The plasma processing apparatus of claim 2, wherein the guide hole is formed to vertically penetrate the sidewall, a space between the sidewall and the insulating plate, or both of the electrode plate and the insulating plate.

4. The plasma processing apparatus of claim 3, wherein the guide hole comprises an upper inlet and a lower outlet of which diameters are larger than an inner diameter of the guide hole.

5. The plasma processing apparatus of claim 1, wherein a diameter of the guide hole is in a range of 0.1 mm to 0.5 mm.

6. The plasma processing apparatus of claim 1, wherein the lower electrode comprises a plurality of electrodes.

7. The plasma processing apparatus of claim 6, wherein the plurality of electrodes is concentric and spaced apart from each other by a predetermined distance.

8. The plasma processing apparatus of claim 7, wherein the plurality of electrodes belongs to one of two groups each of which receives one of an RF voltage and a ground voltage and moves up and down on a group-by-group basis.

9. The plasma processing apparatus of claim 8, wherein the RF voltage is controlled within the range of approximately 400 KHz to approximately 100 MHz.

10. The plasma processing apparatus of claim 9, wherein the RF voltage has a dual frequency.

11. The plasma processing apparatus of claim 1, wherein the diameter of the lower electrode is larger than the diameter of the substrate.

12. The plasma processing apparatus of claim 1, further comprising:
    a lower lift coupled with the lower electrode to lift up/down the lower electrode; and
    an upper lift coupled with the upper electrode to lift up/down the upper electrode.

* * * * *